United States Patent [19]
Riebman

[11] Patent Number: 5,166,647
[45] Date of Patent: * Nov. 24, 1992

[54] LOW-NOISE OSCILLATOR

[75] Inventor: Leon Riebman, Rydal, Pa.

[73] Assignee: AEL Defense Corp., Lansdale, Pa.

[*] Notice: The portion of the term of this patent subsequent to Jun. 2, 2009 has been disclaimed.

[21] Appl. No.: 825,680

[22] Filed: Jan. 27, 1992

Related U.S. Application Data

[63] Continuation-in-part of Ser. No. 658,285, Feb. 20, 1991.

[51] Int. Cl.⁵ .......................... H03B 5/08; H03B 5/18
[52] U.S. Cl. .................... 33/107 S; 331/74; 331/96; 331/167
[58] Field of Search .......................... 331/69, 74, 96, 99, 331/101, 107 DP, 107 SL, 107 S, 109, 117 FE, 117 D, 117 R, 167

[56] References Cited

U.S. PATENT DOCUMENTS

| | | | |
|---|---|---|---|
| 2,704,431 | 3/1955 | Steele | 58/24 |
| 3,316,499 | 4/1967 | Zinn et al. | 331/70 |
| 3,596,203 | 7/1971 | Sakamoto | 331/96 |
| 3,617,924 | 11/1971 | Fujita | 331/70 |
| 4,290,017 | 9/1981 | Fortunko | 331/96 X |
| 4,749,963 | 6/1988 | Makimoto et al. | 331/99 |
| 4,797,614 | 1/1989 | Nelson | 324/236 |
| 4,901,038 | 2/1990 | Dusclaux et al. | 331/167 |

*Primary Examiner*—David Mis
*Attorney, Agent, or Firm*—Seidel, Gonda, Lavorgna & Monaco

[57] ABSTRACT

A low-noise oscillator has a resonant circuit for generating a signal at a desired frequency. A linear amplifier and a limiter are electrically connected to the resonant circuit at first, second and third locations. A buffer amplifier is electrically connected to the resonant circuit at a fourth location and applies the signal generated by the resonant circuit to a load. The first, second, third and fourth locations are selected to minimize the impedance from those locations to ground at 1/f frequencies.

6 Claims, 2 Drawing Sheets

LOW-NOISE OSCILLATOR

CROSS-REFERENCE TO RELATED APPLICATION

This application is a continuation-in-part of co-pending application Ser. No. 07/658,285, filed Feb. 20, 1991, and assigned to the same assignee as the instant application.

FIELD OF THE INVENTION

The present invention relates to an oscillator which has low noise, in particular low phase noise, in the vicinity of its center frequency.

BACKGROUND OF THE INVENTION

A typical oscillator comprises a resonator (usually, but not always an inductor and a capacitor), an amplifier, a limiter and a load. The resonator is driven by the amplifier, which supplies the resonator with energy. Part of the energy in the resonator is applied to the input of the amplifier through a feedback circuit in order to keep the resonator in oscillation. The resonator and the amplifier thus form a closed loop. The rest of the energy is applied to the load, for useful work.

The output of the amplifier is greater than the sum of the power dissipated in the resonator, the power applied to the amplifier, and the power applied to the load. This is because all oscillators require a loop gain greater than unity in order to operate. An oscillator will not function if, at the oscillator frequency, the magnitude of the product of the gain of the amplifier and the feedback factor of the feedback circuit is less than unity. If the loop gain is less than unity, the oscillations will decay to zero. In theory, the oscillator will operate if the loop gain is exactly equal to one, the so-called Barkhausen condition. However, as a practical matter, an oscillator in which the loop gain is exactly unity is an abstraction which is completely unrealizable in practice. Therefore, a practical oscillator always has a loop gain slightly larger than one to ensure that, with incidental yet inevitable variations in circuit parameters, the loop gain does not fall below unity.

Of course, with a loop gain greater than unity, a signal of one volt, for example, appearing initially at the input will, after a trip around the loop, appear at the input as a signal larger than one volt. After another trip around the loop, this larger signal will become still larger, and so on. The amplitude of the oscillator output will therefore continue to increase unless it is limited, either by a discrete limiting circuit or by non-linearities (either inherent or intentionally introduced) in the amplifier or the resonator themselves.

An example of an oscillator in which nonlinearities in the resonator are relied on to limit the oscillations is disclosed in U.S. Pat. No. 4,901,038. However, that patent recognizes that the non-linear resonator introduces noise into the oscillator. In particular, low frequency noise in the resonator is converted to high-frequency noise, in particular phase noise. To minimize noise introduced by the non-linear resonator, it is composed of superconducting elements kept at cryogenic temperatures.

There are other noise sources, however, which U.S. Pat. No 4,901,038 does not take into account and, therefore, does not suggest how to eliminate. There is residual Johnson noise (i.e., thermal noise) even at cryogenic temperatures, and possibly granular noise, in the resonator, which results in noise energy across the spectrum from DC to well above the resonator frequency. In addition, the input circuit to the linear amplifier feeds back both 1/f noise and Johnson noise to the resonator. The 1/f noise is inherent in active semiconductor devices. Below a certain frequency, perhaps 1 MHz, noise usually increases with decreasing frequency, approximately proportional to 1/f. This 1/f noise is usually attributed to surface conduction and modulation effects in the semiconductor device. In the medium frequency range, the noise figure is constant and lowest for a given device. At higher frequencies, the noise begins to increase again with frequency. Moreover, even a good "linear" amplifier will have some residual non-linearity which frequency-mixes, or beats with, any noise energy coming into the amplifier. The load also feeds back Johnson noise to the resonator. To provide power to an output load requires more energy (i.e., higher gain) from the linear amplifier, which requires additional amplifier current which, in turn, produces more noise. Finally, a separate limiter introduces noise due to its limiting action. This can include both 1/f noise and broadband Johnson noise.

All of these noise sources are known to contribute to both amplitude noise (in phase with the oscillator signal) and phase noise (out of phase with the oscillator signal). Phase noise is especially detrimental, in that it introduces spurious frequency components which limit the usefulness of the oscillator in many applications.

It is therefore one object of the invention to provide an oscillator which provides a minimum of noise fed back into the resonator, which, in turn, provides an oscillator with extremely low noise and, in particular, low phase noise in the vicinity of the oscillator center frequency.

SUMMARY OF THE INVENTION

The present invention is a low-noise oscillator comprising resonant circuit means for generating a signal at a desired frequency, linear amplifier means electrically connected to the resonant circuit means at first and second locations thereon, limiter means electrically connected to the resonant circuit means at a third location thereon, and buffer amplifier means for applying the signal generated by the resonant circuit means to a load and electrically connected to the resonant circuit means at a fourth location thereon. The first, second, third and fourth locations are selected to minimize impedance at 1/f frequencies from the locations to electrical ground and to minimize Johnson noise into the resonant circuit.

BRIEF DESCRIPTION OF THE DRAWINGS

For the purpose of illustrating the invention, there is shown in the drawings a form which is presently preferred; it being understood, however, that this invention is not limited to the precise arrangements and instrumentalities shown.

DESCRIPTION OF THE INVENTION

Figure 1:
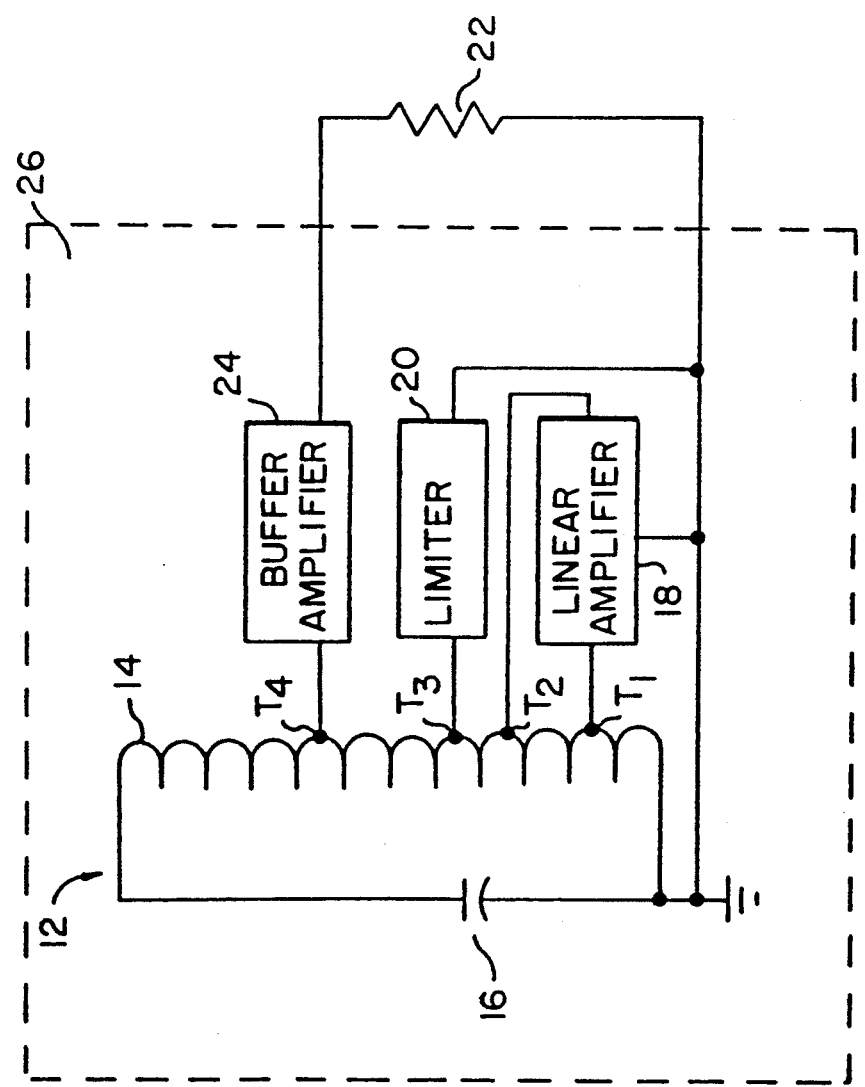
FIG. 1 is a simplified schematic diagram of an oscillator according to the present invention.

Referring now to the drawings, wherein like numerals indicate like elements, there is shown in FIG. 1 a simplified schematic diagram of an oscillator 10 according to the invention. Oscillator 10 comprises a resonator 12, which is illustrated as an LC tank circuit composed of an inductor 14 and a capacitor 16. Although resonator 12 is shown as an LC tank circuit, it should be understood that any other type of resonator, such as a tuned cavity resonator, can be used without departing from the scope of the invention.

A linear amplifier 18 is connected to and supplies energy to resonator 12. Linear amplifier is constrained to operate in its linear range to avoid introducing noise due to non-linear mixing into oscillator 10. By keeping linear amplifier 18 within its linear range, the effects of residual non-linearity (which result in frequency-mixing noise energy coming into the linear amplifier) are minimized.

The oscillator is stabilized by a limiter 20, which can, for example, be composed of a pair of antiparallel diodes, although the limiter 20 is not restricted to this structure. Limiting may also be achieved by designing the resonator 12 to become non-linear and begin overloading at a specific circuit voltage.

It can be seen from FIG. 1 that a portion of the energy of resonator 12 is applied to linear amplifier 18, where it is amplified and fed back to resonator 12. A portion of the energy is provided to limiter 20 and the remaining portion of the energy of resonator 12 is applied to a load 22, where it can be put to a desired use, such as a carrier for a modulator, a frequency reference, and so forth. Resonator 12 is isolated from load 22 by a buffer amplifier 24, to minimize noise feedback from the load and to minimize current loading of the resonator. It will be appreciated that a large load current demand on the resonator will require a greater current output from linear amplifier 18 which, in turn, tends to increase the noise introduced into oscillator 10.

As shown in FIG. 1, linear amplifier 18, limiter 20 and buffer amplifier 24 are all connected to coil 14 of resonator 12 at respective tap points $T_1$ through $T_4$. Although $T_1$, $T_2$, $T_3$ and $T_4$ are shown in order of increasing distance from electrical ground, they need not be in that order, and may be located anywhere along coil 14 consistent with minimizing noise, as discussed below.

Linear amplifier 18 is designed so that the noise that it introduces from its input circuit to the resonator is minimized, and so that the noise from the feedback circuit is also minimum. To accomplish this for a given linear amplifier, it is important to find the proper locations for the tap points on the resonator so that both the input to the amplifier and the output of the amplifier are optimized for minimum contribution to the noise circuit. Recognizing that both sources of noise contribution from the linear amplifier (the amplifier input circuit and the feedback circuit) contain 1/f noise, it becomes important to minimize the impedance to ground for both these respective tap points at frequencies (referred to herein as "1/f frequencies") at which 1/f noise is likely to be significant.

Figure 2:
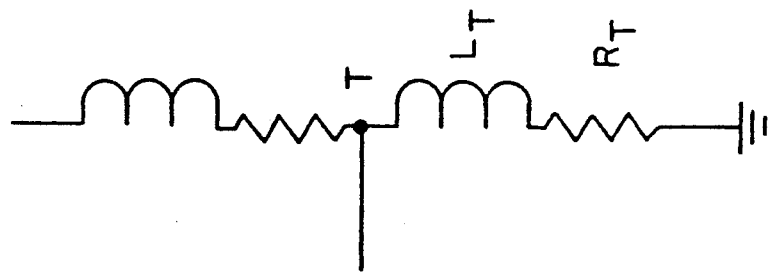
FIG. 2 is a simplified schematic representation of an equivalent circuit of a portion of the oscillator of FIG. 1.

Referring now to FIG. 2, the impedance to ground from a given tap point is schematically illustrated as a discrete inductor $L_T$ in series with a discrete resistor $R_T$, connected between the tap point T and ground. Inductor $L_T$ represents the inductive component attributable to that portion of coil 14 which is physically and electrically between tap point T and ground, and resistor $R_T$ represents the resistive component of that portion of coil 14. The impedance between tap point T and ground at 1/f frequencies is expressed quite accurately by the equation $$Z=(R_T^2+w^2L_T^2)^{\frac{1}{2}} \quad (1)$$

where $R_T$ is the resistance to ground and $wL_T$ is the inductive reactance to ground at 1/f frequencies. Both $R_T$ and $L_T$ for a superconductor can vary significantly at 1/f frequencies when compared to their values at oscillator frequency.

To minimize the impedance Z, it is desirable not only to minimize $R_T$ at the 1/f frequencies, but also to use the maximum value of capacitance of capacitor 16 to minimize the inductance of coil 14 consistent with maintaining maximum Q for the resonator. In general, the Q, or "quality factor," of an LC tank circuit is given by $$Q=1/R[(L/C)^{\frac{1}{2}}] \quad (2)$$

where L is the inductive reactance, C is the capacitive reactance, and R is the effective resistance of the tank circuit. It can be seen from equation (2) that Q can also be increased by decreasing the effective resistance R.

Thus, by locating the tap points as close to ground as possible, and by selecting the capacitance value of capacitor 16 and the thickness of the superconducting film for minimum impedance at 1/f frequencies, the amount of 1/f noise input to the oscillator is greatly reduced.

Likewise, the buffer amplifier input should be located at a tap point on coil 14 to optimize the following conditions: minimizing the impedance at 1/f frequencies between the input of the buffer amplifier and ground, minimize both the resistive loading of the tank circuit and the noise input to the tank circuit from the buffer amplifier, and keep the noise power added to the useful power passed to the load to be relatively negligible. The exact tap point may readily be located empirically.

Figure 3:
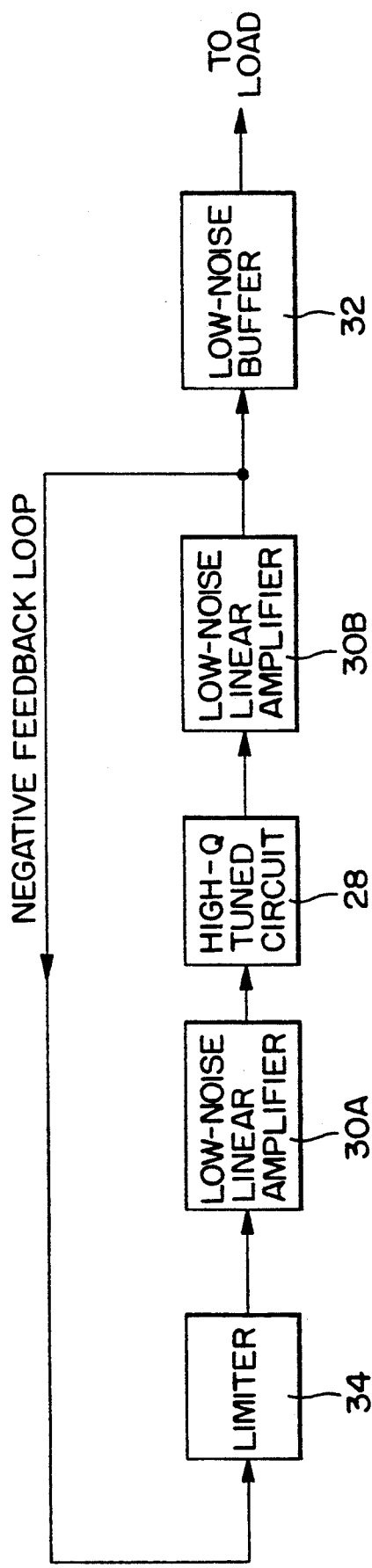
FIG. 3 is a simplified schematic diagram illustrating one way of realizing an oscillator according to the present invention.

One, but by no means the only, way of realizing an oscillator according to the invention is illustrated in FIG. 3. In FIG. 3, the high-Q tuned circuit 28 corresponds to resonator 12 in FIG. 1 and, like resonator 12, may be any high-Q resonator. For example, high-Q tuned circuit 28 could be, but is not limited to, a tank circuit, a tuned cavity, or a cryogenic resonator, to give just a few examples. Low-noise linear amplifier stages 30A and 30B correspond to linear amplifier 18 in FIG. 1. FIG. 3 illustrates the low-noise linear amplifier as two separate stages 30A and 30B, but this is simply a design convenience, and the low-noise linear amplifier need not be so divided.

The output of high-Q tuned circuit 28 is connected by a tap point, such as $T_1$ in FIG. 1, to the second stage 30B of the low-noise linear amplifier, in a manner as described in connection with FIG. 1, so as to optimize the minimum loading of the high-Q tuned circuit 28 while maximizing the oscillator signal-to-amplifier-noise ratio at the output of amplifier stage 30B. Low-noise buffer 32, which corresponds to buffer amplifier 24 in FIG. 1, is connected to the oscillator via a tap point such as $T_4$, to minimize loading of the high-Q tuned circuit 28. Amplifier stage 30B acts to both buffer the loading effect of the low-noise buffer 32 itself and to increase the oscillator signal level into the buffer. At the same time, the loading effect of the low-noise buffer 32 on the feedback loop must be minimized in order to minimize noise in the loop. The exact location of the tap point $T_4$ must be optimized as already described in connection with FIG. 1 to minimize noise in the feedback loop and maximize the oscillator-signal-to-buffer-amplifier-noise ratio in the output to the load.

Limiter 34 corresponds to limiter 20 in FIG. 1. Optimally, limiter 34 maintains the maximum oscillator power so that the amplifiers stages 30A and 30B always operate in their linear ranges, while minimizing the limiter's own contribution to oscillator 1/f noise. The limiter 34 is the only non-linear element in the oscillator and, hence, the only element which can cause 1/f noise to mix with the noise present in the oscillator frequency range. This mixing can add significant noise close to the oscillator frequency. Care must be taken to ensure that the limiter does not cause amplitude-to-phase modulation conversion. This can be done by adjusting the limiter impedance at its operating point to match the RF source impedance in the feedback circuit.

The circuit illustrated in FIG. 1 and the realization of the circuit shown in FIG. 3 are electrically the same. The physical difference is that, in the realization of FIG. 3, the limiter is buffered from the oscillator tuned circuit 28 by amplifier stage 30B.

In summary, but not by way of limitation, it is desirable to use as high an unloaded Q as possible for the frequency-determining tuned circuit or cavity. This minimizes Johnson (resistive) noise at the oscillator frequency. It is also desirable to minimize all resistive loading (i.e., to maximize the loaded Q) of the tuned circuit. This further minimizes noise generated at the oscillator frequency. Mixing of the 1/f transistor noise with noise at the oscillator frequency is eliminated by using a low-noise linear amplifier in the negative feedback loop. The linear amplifiers should be designed to minimize the loading on the tuned circuit. Low-noise linear buffer amplifiers are desirable to provide power at the oscillator frequency to a load. The input stage of the buffer amplifier should be designed to minimize its loading of the tuned circuit and the feedback loop. Loading of the negative feedback loop requires more feedback current which, in turn generates more feedback noise. Also, the oscillator input to the linear buffer amplifier should be significantly higher than the linear buffer amplifier noise so that the oscillator noise is negligibly affected. Finally, use of a separate limiter with minimum 1/f noise maintains the system voltages within the linear ranges of both the low-noise linear amplifiers and the low-noise linear buffer amplifiers. One, but by no means the only, form of limiting can be a peak detector output used as a feedback bias. The degree of limiting is preferably consistent with amplitude and frequency stability of the oscillator as related to fluctuations or aging of the individual electronic components associated with the realized oscillator.

It will be appreciated that the present invention provides a novel and unobvious oscillator circuit which eliminates or greatly reduces sources of noise from a variety of sources, and which is therefore free from the problems associated with noisy oscillators.

The present invention may be embodied in other specific forms without departing from the spirit or essential attributes thereof and, accordingly, reference should be made to the appended claims, rather than to the foregoing specification, as indicating the scope of the invention.

I claim:

1. An oscillator having low phase noise and low 1/f noise, comprising
   (a) resonant circuit means for generating a signal at a desired frequency,
   (b) linear amplifier means electrically connected to the resonant circuit means at first and second locations thereon,
   (c) limiter means electrically connected to the resonant circuit means at a third location thereon, and
   (d) buffer amplifier means for applying the signal generated by the resonant circuit means to a load and electrically connected to the resonant circuit means at a fourth location thereon,
   said first, second, third and fourth locations being selected to minimize impedance from said locations to electrical ground at frequencies at which substantial 1/f noise is present and to minimize resistive loading of the resonant circuit means and noise input to the resonant circuit means from the buffer amplifier.

2. An oscillator according to claim 1, wherein the inductance of the inductor means and the capacitance of the capacitor means are chosen to yield a desired Q for the resonant circuit means at a minimum value of inductance.

3. A low phase noise, low 1/f noise oscillator, comprising
   (a) resonant circuit means for generating an oscillator signal at a desired frequency,
   (b) a low-noise linear amplifier connected to the resonant circuit means for receiving an output therefrom and for generating an amplified output signal at said desired frequency,
   (c) a low-noise buffer for buffering said amplified output signal from the low-noise linear amplifier to a load, the buffer having an output to said load,
   (d) feedback means for feeding back a negative feedback signal comprising a portion of the amplified output signal from the low-noise linear amplifier to the input of a limiter means for limiting said feedback signal to a preselected amplitude,
   (e) a low-noise linear amplifier for receiving the feedback signal limited by the limiter means and for amplifying said signal, said low-noise linear amplifier having an output connected to said resonant circuit means,
   said resonant circuit means, linear amplifier, low noise buffer and feedback means being interconnected to minimize loading of the resonant circuit means and maximize the oscillator-signal-to-noise ratio at the output of the low-noise buffer to the load.

4. An oscillator according to claim 3, wherein the resonant circuit means comprises a high-Q tuned circuit.

5. An oscillator according to claim 4, wherein the tuned circuit comprises an LC tank circuit.

6. An oscillator according to claim 4, wherein the tuned circuit comprises a tuned cavity resonator.

* * * * *